United States Patent [19]
Carter et al.

[11] Patent Number: 5,643,540
[45] Date of Patent: Jul. 1, 1997

[54] PROTEIN CRYSTAL GROWTH APPARATUS FOR MICROGRAVITIY

[75] Inventors: Daniel C. Carter, Decatur; Timothy E. Dowling, Huntsville, both of Ala.

[73] Assignee: The United States of America as represented by the Administrator of the National Aeronautics and Space Administration, Washington, D.C.

[21] Appl. No.: 394,863

[22] Filed: Feb. 27, 1995

[51] Int. Cl.⁶ .................................................. B01D 9/00
[52] U.S. Cl. ..................... 422/245.1; 117/200; 117/202; 422/100
[58] Field of Search ..................... 23/295 T, 295 R; 117/200, 201, 202, 206, 207; 422/99, 100, 245.1

[56] References Cited

U.S. PATENT DOCUMENTS

| | | | |
|---|---|---|---|
| 4,886,646 | 12/1989 | Carter et al. | 117/202 |
| 4,909,933 | 3/1990 | Carter et al. | 210/95 |
| 4,960,572 | 10/1990 | Wittke et al. | 117/206 |
| 5,013,531 | 5/1991 | Snyder et al. | 117/223 |
| 5,096,676 | 3/1992 | McPherson et al. | 117/206 |
| 5,106,592 | 4/1992 | Stapelmann et al. | 117/206 |
| 5,130,105 | 7/1992 | Carter et al. | 422/215 |

OTHER PUBLICATIONS

McPherson, "Preparation and Analysis of Protein Crystals," 1982, Chapter 4, pp. 82–127.

Bugg, "The Future of Protein Crystal Growth," Journal of Crystal Growth 76 (1986) pp. 535–544, North–Holland, Amsterdam.

Miller, et al., "A comparison between protein crystals grown with vapor diffusion methods in microgravity and protein crystals using a gel liquid–liquid diffusion ground based method," Journal of Crystal Growth 122 (1992), pp. 306–309, North–Holland, Amsterdam.

Gernert, et al., "A Simple Apparatus for Controlling Nucleation and Size in Protein Crystal Growth," Analytical Biochemistry 168, pp. 141–147 (1988), U.S.A.

*Primary Examiner*—Felisa Garrett
*Attorney, Agent, or Firm*—Jerry L. Seemann

[57] ABSTRACT

Apparatus for growing protein crystals under microgravity environment includes a plurality of protein growth assemblies stacked one above the other within a canister. Each of the protein growth assemblies includes a tray having a number of spaced apart growth chambers recessed below an upper surface, the growth chambers each having an upstanding pedestal and an annular reservoir about the pedestal for receiving a wick and precipitating agents. A well is recessed below the top of each pedestal to define a protein crystal growth receptacle. A flexible membrane is positioned on the upper surface of each tray and a sealing plate is positioned above each membrane, each sealing plate having a number of bumpers corresponding in number and alignment to the pedestals for forcing the membrane selectively against the upper end of the respective pedestal to seal the reservoir and the receptacle when the sealing plate is forced down.

29 Claims, 3 Drawing Sheets

PROTEIN CRYSTAL GROWTH APPARATUS FOR MICROGRAVITY

ORIGIN OF THE INVENTION

This invention was made by employees of the United States Government and may be manufactured and used by or for the Government for govermental purposes without the payment of any royalties.

BACKGROUND OF THE INVENTION

(1) Field of Invention

This invention relates to apparatus for growing crystals under microgravity conditions, and more particularly to apparatus having a large number of growth chambers for growing crystals such as protein crystals by the vapor diffusion method under microgravity conditions.

(2) Description of the Prior Art

One of the methods of growing protein crystals is the vapor diffusion method which decreases the solubility and concentrates the molecules to be crystallized by solvent evaporation. For example, the protein to be crystallized is placed in solution in a growth compartment and a solution of precipitating agent is placed in a reservoir about the protein solution. In microgravity experiments, the precipitating solution generally is absorbed in wicking material in the reservoir. Evaporation of the protein proceeds at a rate at least partly dependent upon the vapor pressure difference between the protein droplet solution and the reservoir, and as evaporation progresses the solution becomes supersaturated with protein and crystallization occurs. Nucleation rate and crystal size are highly dependent upon the rate at which critical supersaturation is approached. As noted in Carter et al U.S. Pat. No. 4,886,646, a slow approach results in decreased crystal nucleation rate and a corresponding increase in crystal size and quality.

Protein crystal growth under microgravity conditions results in substantially increased crystal size and quality. The application of the microgravity environment is the subject of several ongoing investigations which aim to increase the size and internal order of protein crystals. Numerous successful applications of the microgravity environment to the growth of high quality protein crystals have been well documented. This is extremely important, since the ability to produce high quality protein crystals has been the limiting step in a number of important macromolecule structural problems. Presently, the field of macromolecular crystallography is undergoing a major technological revolution which permits more efficient and difficult structure determinations. These improvements coupled with the advances in recombinant technologies are providing an increase in the number of structures determined yearly. At the present time, some 1,000 structures have been determined by crystallographic methods. Based on the rate of increase each year, it is estimated that over 10,000 macromolecular structures will have been determined by the year 2000. In view of this, the current demand for high quality crystals will double approximately every two to three years for the next ten years.

Typically, the growth of large, high quality protein crystals using ground-based methods requires numerous crystallization surveys to identify and maximize the proper growth conditions. While advanced concepts in protein crystallization hardwares seek to optimize the growth of protein crystals by elaborate monitoring and dynamic control of a single experiment, these devices have yet to demonstrate superior crystal quality and appear to be many years away from routine use by practicing crystallographers. This points toward the continuing use of simple multiparameter crystallization screens well into the early years of the Space Station. In addition, this type of screening can be very simple, inexpensive and effective.

Vapor diffusion apparatus specially adapted for growing crystals under microgravity conditions is disclosed in Snyder et al. U.S. Pat. No. 5,103,531, wherein a refrigerator-incubator module receives a carrier assembly which fixes a plurality of tray assemblies within the module. Each tray assembly includes a plurality of sealed chambers with a plastic double barrel syringe and a plug for the double tip of the syringe. Protein solution is contained in one barrel and precipitating solution is contained in the other barrel. Ganging mechanisms operate pistons within the barrels of the syringes and the plugs. When activated, the plug is retracted through a chamber having reservoir material including precipitating solution and the protein solution and precipitating solution are extracted from the barrels to form a drop of lower concentration of precipitating agent than precipitating solution in the reservoir material. Water moves by vapor transport from the protein solution drop to the reservoir precipitant solution until vapor pressure equilibrium is achieved. Crystallization starts at or before equilibrium of the vapor pressure. After crystal growth or the end of microgravity conditions, the protein solution with the crystals suspended therein is drawn back into the barrels which are then plugged. This apparatus requires late loading of the proteins and reagents and late access to the flight vehicle. Also, during activation, mixing of solutions may not always occur successfully. Additionally, and most significantly, the design of the apparatus has a limiting effect on the number of crystal growth chambers available for investigation.

In McPherson U.S. Pat. No. 5,096,676, an apparatus is disclosed for growing protein crystals by vapor diffusion techniques, the apparatus comprising a tray having a plurality of equilibrating solution reservoirs including a column or pedestal disposed within each reservoir and having a protein solution receptacle in the top of the column. A cover with an adhesive material seals the top of the tray to seal the reservoirs from atmosphere. Similar apparatus is disclosed in Carter et al. U.S. Pat. No. 5,130,105 wherein a single level vapor diffusing protein crystal growth tray assembly is proposed having a plurality of individual crystal growth chambers. Each chamber has a pedestal including a crystal growth compartment at the upper end into which protein solution is receivable, the pedestals being slidably received through an annular reservoir which contains a wick in which precipitant solution is absorbed. After the solutions are in place, the upper surfaces of the pedestals are moved upwardly to engage a tape sealent to separate the solutions in the growth compartments and the respective reservoirs. When microgravity conditions are encountered, the pedestals are lowered to permit vapor diffusion crystal growth to proceed.

SUMMARY OF THE INVENTION

Consequently, it is a primary object of the present invention to provide a protein crystal growth assembly for use in the vapor diffusion growth of protein crystals, each assembly having a tray including a plurality of growth chambers.

It is another object of the present invention to provide apparatus having a large number of growth chambers for processing a large number of samples of protein crystallized by vapor diffusion in microgravity.

It is a further object of the present invention to provide apparatus for growing protein crystals under microgravity environments of space flight which permits ready loading on the ground and ready use during flight, and increases the number of growth chambers available.

It is a still further object of the present invention to provide protein crystal growth apparatus for microgravity which permits rapid, convenient access to the microgravity environment, a greater number of samples, and elimination of numerous problems associated with logistics and presently used apparatus.

Accordingly, the present invention provides apparatus wherein a plurality of protein growth assemblies, each having a tray including a number of protein growth compartments and precipitating solution reservoirs, may be stacked one upon the other within a canister, deactivated simultaneously by means associated with the canister, and stowed in that condition until microgravity environment is attained. Thereafter, all of the growth assemblies may be activated simultaneously to establish vapor equalization and commence crystal growth by activation means associated with the canister. The means for deactivating and activating the vapor diffusion process preferably comprises a movable plate at one end of the canister which may be selectively engaged for movement toward and away from the tray assemblies.

Each growth assembly includes a disposable tray having a plurality of pedestals about which a respective annular reservoir is disposed, a precipitate absorption insert, such as a wick, disposed within each reservoir, a sealable flexible membrane disposed upon the tray overlaying each reservoir and pedestal, and a sealing plate positioned above the membrane and having a plurality of bumper members equal in number to the number of reservoirs and pedestals and disposed so that each bumper may engage the membrane and urge it into closing relationship with the upper surface of the respective pedestal to close the crystal growth compartment therein while the sealing plate seals the reservoir for deactivating the process. The deactivating and activating means associated with the canister effects movement of the sealing plates.

In the preferred form of the invention, each canister is a cylindrical housing and the trays and bumper plates are disk shaped members. A plurality of such canisters may be positioned side-by-side within a common enclosure having a temperature controlled environment.

BRIEF DESCRIPTION OF THE DRAWINGS

The particular features and advantages of the invention as well as other objects will become apparent from the following description taken in connection with the accompanying drawings in which.

DESCRIPTION OF THE PREFERRED EMBODIMENT

Figure 1:
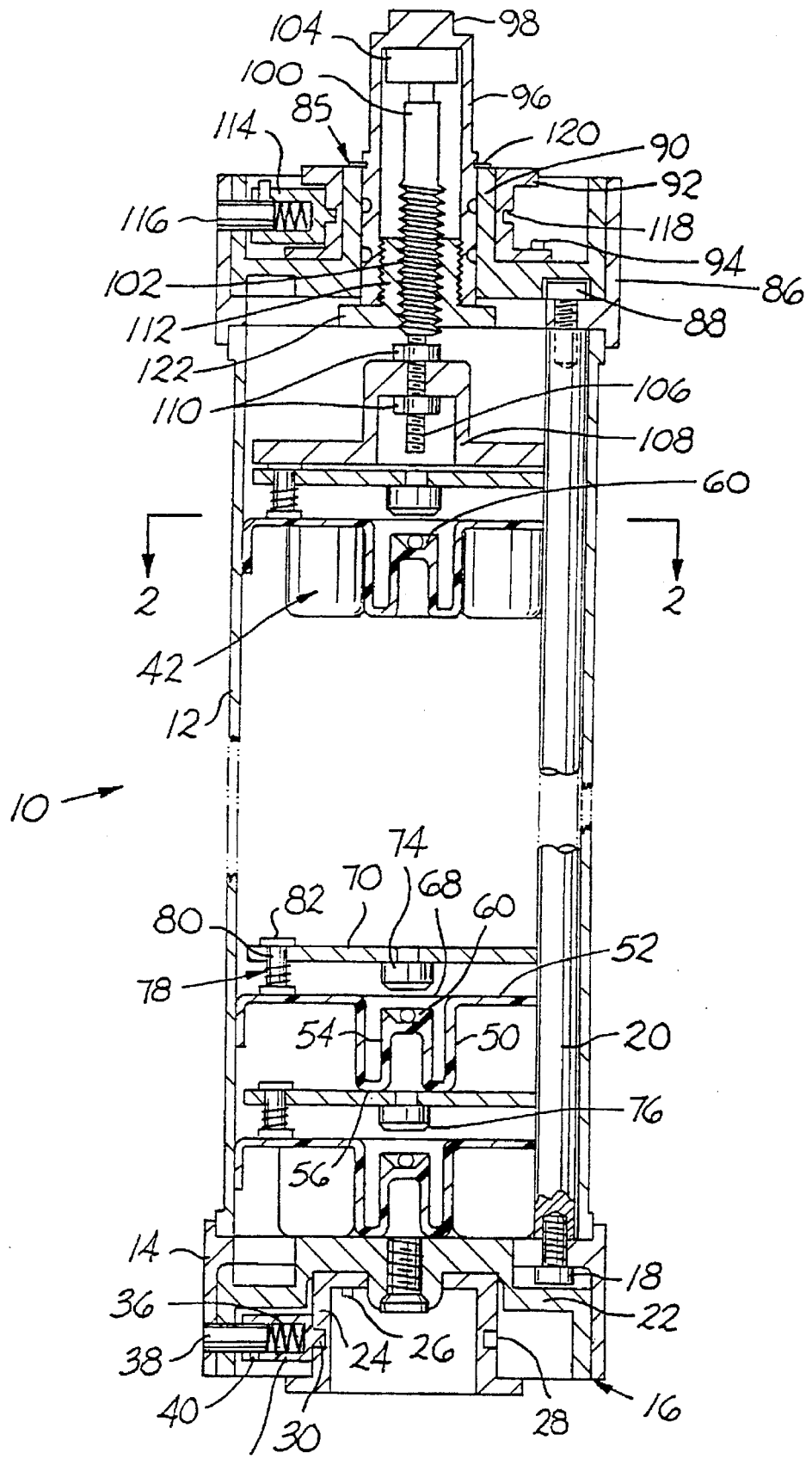
FIG. 1 is a vertical cross sectional view of a canister including a plurality of protein crystal growth tray assemblies constructed in accordance with the present invention, portions of the canister being broken away for clarity of presentation.

Referring now to the drawings, protein crystal growth apparatus 10 constructed in accordance with the present invention comprises a hollow elongated canister 12 preferably having a cylindrical form and constructed from aluminum. Positionable about the lower end of the canister 12 is an outer lower annular end plate 14 forming a portion of a lower closure assembly 16 having three bored holes for receiving a respective bolt 18 which is secured to one end of a respective elongated guide rod 20 positionable within the canister and extending substantially parallel to the axis of elongation thereof when so positioned.

Positioned about the lower end of the canister within the annulus of the outer plate 14 is a lower cover member 22 to which a collar 24 is secured as by screws 26 or the like. The collar 24 has an annular groove 28 which receives a nib 30 of a pin housing 32 positioned between the cover member 22 and the collar 24. A spring, coiled, is disposed within a bore in the housing 32 A pin 38 is received through a bore in the lower end plate 14 and a bore in the lower cover member 22 when the cover member and the end plate are properly positioned so that the bores are aligned, and is received into the bore of the pin housing 32 to engage the spring 36 to force the nib 30 into the groove 28. When the nib is within the groove, the outer surface of the pin 38 is substantially coplanar with the outer surface of the end plate 14. A screw 40 or the like threaded into a tapped hole in the pin 38 is then tightened to secure the lower closure assembly 16 comprising the end plate 14, the cover member 22 and the collar 24 together as a unit with the guide rods 20, and the lower assembly 16 may be positioned at the lower end of the canister 12 and the rods may then be received within the canister 12.

Figure 2:
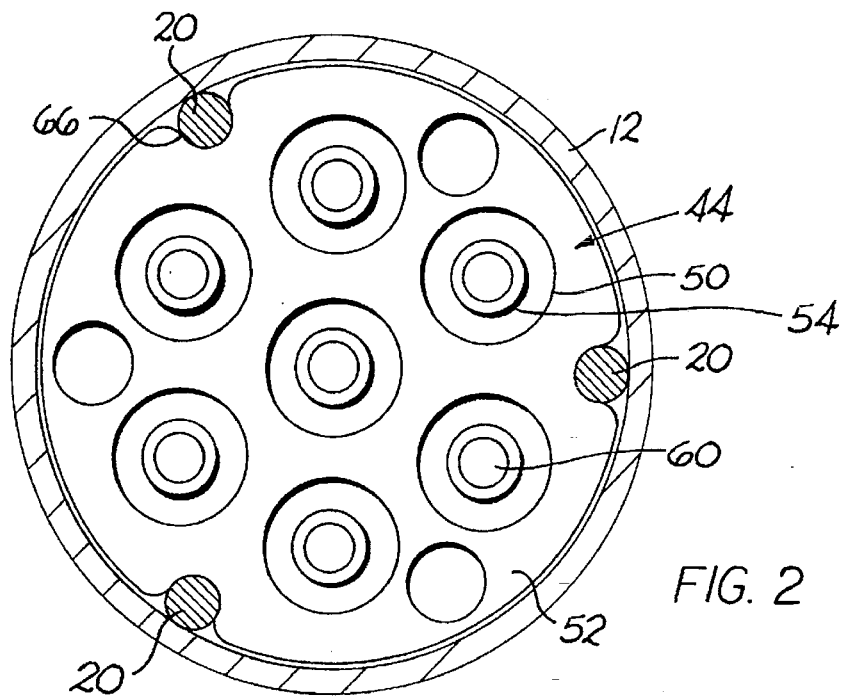
FIG. 2 is a cross sectional view taken substantially along line 2—2 of FIG. 1.
Figure 3:
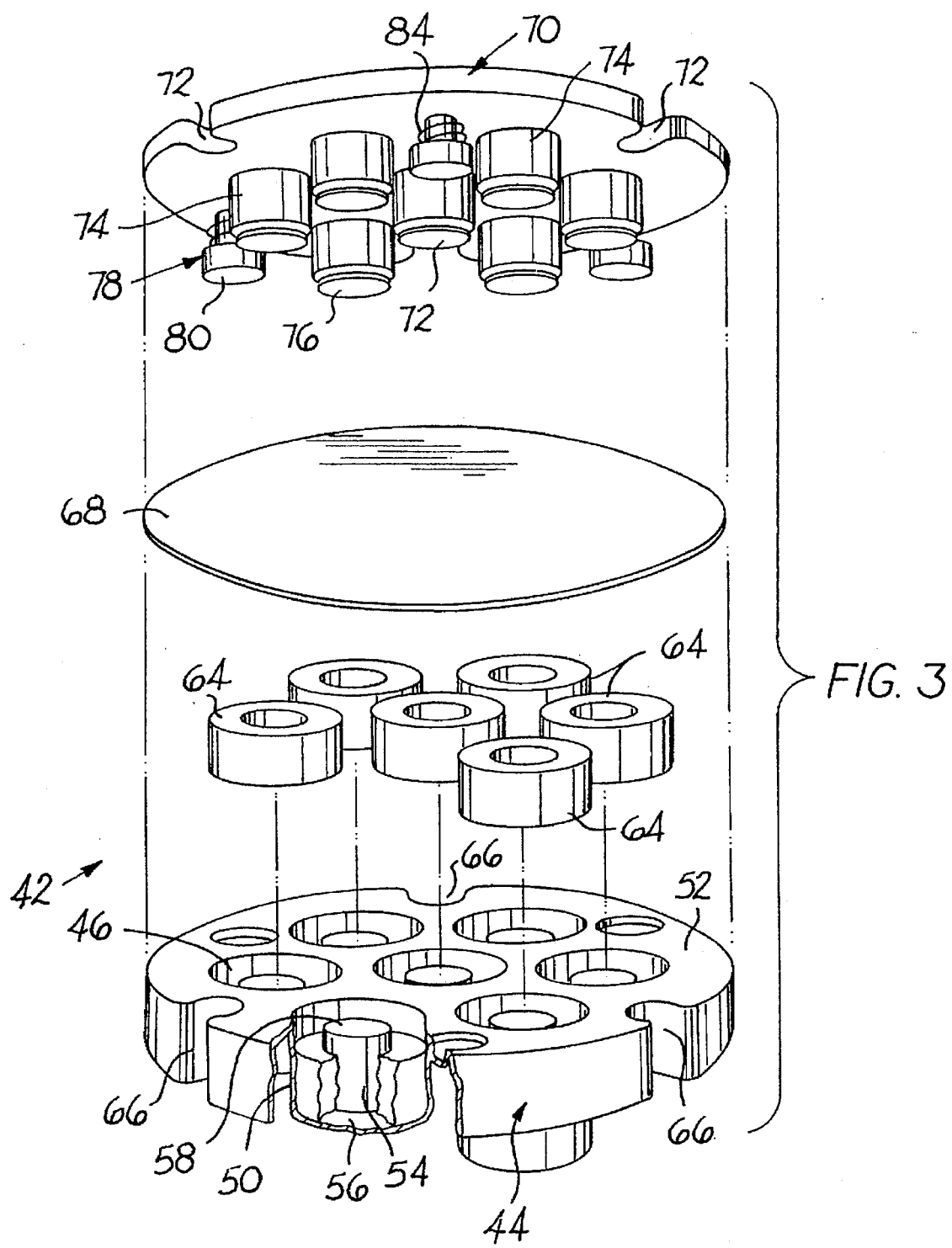
FIG. 3 is an exploded perspective view of the crystal growth assemblies.

With the lower assembly and the rods positioned relative to the canister as aforesaid, a plurality of crystal growth assemblies generally indicated at 42 may be loaded into the canister. Each crystal growth assembly, as best illustrated in FIGS. 2 and 3, comprises a plastic tray or plate 44 having a cylindrical or disk-shape configuration corresponding in external diameter to the internal diameter of the canister 12. Each tray 44 has a plurality of growth chambers 46 which may vary selectively in number, seven such chambers being illustrated in the preferred embodiment. The growth chambers 46 each have a substantially cylindrical outer wall 50 extending downwardly from an upper planar surface 52 of the tray 44 and an internal wall 54, the outer and inner walls defining an annular space therebetween and terminating at a bottom wall 56 so that the annular cavity therebetween may form a reservoir. The inner cylindrical wall 54 extends upwardly to form a pedestal 58 which terminates at its upper end in a small depression or well 60 recessed below its upper end 62, the latter being at a disposition below the upper surface 52.

Positioned within each reservoir defined by the annular space between the walls 50, 54 and 56 is an annular shaped wick 64 of a porous material such as a high molecular weight polyethylene. The wick absorbs a precipitating agent placed into the reservoir and provides sufficient surface area for the vapor equalization process to occur during growth of protein crystals as disclosed and discussed in the aforesaid U.S. Pat. No. 5,130,105, the protein solution of course, being placed within the well 60 at the top of the pedestal. Each tray 44 also preferably includes a number of vertically extending indentations 66 at the outer periphery, the indentations being equal in number to the number of guide rods 20 and spaced about the tray at locations so as to receive a respective guide rod when the tray is positioned within the canister.

Disposed above each tray is a thin flexible sealable preferably elastomeric membrane 68 of a size adapted to overlay the upper surface 52 of the respective tray. Disposed above the membrane is a sealing plate 70 preferably constructed from aluminum and having a generally disk shaped configuration with indentations 72 at its peripheral edge equal in number and similar to the indentations 66 and spaced in like manner also for receiving a respective guide rod 20. Secured to and extending from the lower surface of each sealing plate 70 is a plurality of spaced apart cylindrical plugs 74, equal in number and spaced so as to be aligned with respective pedestals 58 when the sealing plate is positioned within the canister 12 and having an outer diameter substantially equal to that of the wall 54. A silicon rubber bumper 76 is bonded or otherwise fastened to a reduced diameter portion at the free end of each plug 74 and is adapted to engage the membrane 68 and force it into sealing relationship with the upper end 62 of the pedestal to seal the well 60 as hereinafter further described and for reasons hereinafter made clear.

Also connected to and secured to the sealing plate 70 and extending downwardly at therefrom at spaced locations is a plurality of plungers 78, there being three such plungers in the preferred embodiment. Each plunger 78 comprises a peg 80 with an enlarged head at the free end remote from the upper end. The peg, except for the head, being adapted to extend through a bore in the sealing plate 70 and the uppermost portion of the peg is secured to a nut 82 or the like above the upper surface of the plate 70. A spring 84 is coiled about the peg and trapped between the lower surface of the plate 70 and the enlarged free end of the peg 80.

The crystal growth assemblies 42 may be stacked vertically within the canister in seriatim as guided by the guide rods, there preferably being eight to ten such stacked assemblies. Thus, with the disclosed apparatus 56 to 70 growth pedestals may be disposed within a single canister having an overall length of approximately 15 inches. After the individual crystal growth assemblies have been stacked, the upper end of the canister may be closed by an upper closure assembly. The upper closure assembly 85 is positioned within an outer upper end plate 86 disposed about the upper end of the canister and secured by bolts 88 to the upper ends of the guide rods 20.

Positioned about the upper end of the canister 12 within the outer plate 86 is an upper cover member forming part of the assembly 85 to which an upper collar 92 is secured as by screws 94 or the like. The upper cover member 90 includes a centrally disposed bore through which an activation/deactivation assembly is positioned prior to the cover being positioned on the top of the canister, the activation/deactivation assembly comprising an activation housing 96 in the form of a hollow cylindrical body member closed at the top by a preferably hexigonical shaped head 98 which may be grasped by a hand tool having an opening of similar configuration.

Received within the hollow of the housing 96 is an activation link 100 comprising an elongated threaded cylindrical member having coarse threads 102 at the upper portion beneath a head 104 and fine threads 106 at the lower portion. The lower end of the activation link 100 is connected to a yoke shaped activation plate 108, a pair of nuts or the like 110 threaded onto the lower end of the link 100 act to trap and secure the activation plate 108 to the activation link 100. The coarse threads 102 of the activation link are threadely received within a tapped bore in an end cap 112 prior to connection of the activation link to the plate 108 and the bolts 110, and the cap 112 is threaded into the interior of the actuation housing 96.

The upper assembly 85 may then be positioned onto the top of the canister within the interior of the outer plate 86 and a pin housing 114 similar to the lower pin housing 32 is positioned between the cover member 90 and the collar 92 and receives a pin 116 when the nib of the housing 114 is positioned within a groove 118 in the collar and a bore in the plate 86 is aligned with a similar bore in the upper cover 90. The pin is thereafter secured in the same manner as that of the pin 38 of the lower assembly to lock the upper closure and activation assembly to the outer plate 86. A snap ring or the like 120 may act to position the activation housing 96 and the upper cover 90 relative to one another vertically while permitting the activation housing 96 to be rotated relative to the upper cover 90.

Figure 4:
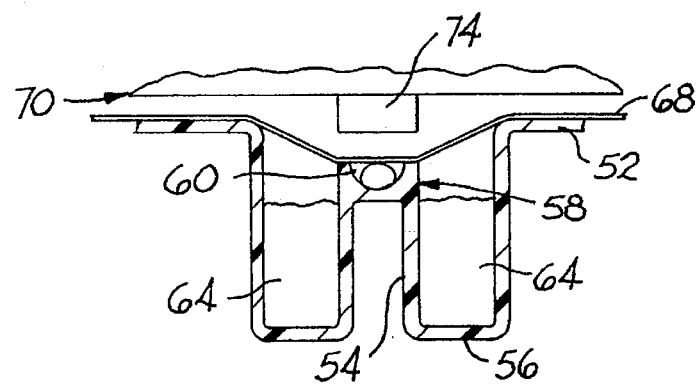
FIG. 4 is a diagrammatic view of a crystal growth chamber illustrating the deactivation thereof.
Figure 5:
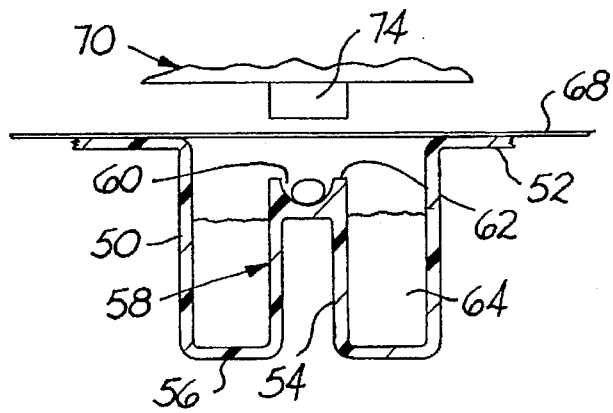
FIG. 5 is a view similar to FIG. 4 illustrating the activation of the growth process.

When the activation housing 96 is rotated, the end cap 112 may rotate and move the activation link 100 and the activation plate 108 axially within the canister 12. A flange 122 at the lower end of the end cap 112 acts as an upper stop or limiter. When the activation housing is rotated in a first direction, the activation plate 108 acts to force the uppermost sealing plate 70 downwardly to drive or urge the membrane 68 into sealing relationship with the uppermost tray 44, as illustrated in FIG. 4, and in so doing acts to drive or urge the other crystal growth assemblies 42 in a similar manner in domino fashion. When the activation housing is rotated in the opposite direction, the force is released and the plungers 78 act to separate the sealing plate bumpers from the respective pedestals 58, as illustrated in FIG. 5.

In use, precipitating solution is loaded onto the wicks 64 in the reservoirs defined between the walls 50, 54 and 56 of the respective trays 44 and protein solutions are loaded into the corresponding well 60 of the pedestals 58. The elastomeric membrane 68 is then placed upon the tray assemblies, the membrane acting to seal the reservoirs. With the lower cover assembly in position and the guide rods 20 positioned within the canister, a plurality of crystal growth assemblies are loaded into the canister, a sealing plate 72, of course, being disposed between an upper tray and the membrane of a lower tray assembly. Each of the crystal growth assemblies are guided in place by the guide rods 20 and stacked in vertical disposition within the canister. The upper end plate 86 is then positioned about the upper end of the canister and secured to the guide rods, and the upper assembly 85 and the activation members are secured in place as aforesaid.

The head 98 of the activation housing 96 may then be rotated to deactivate the crystal growth assemblies by forcing the respective plugs 74 to engage and force the respective membrane 68 to seal the well 60 of each pedestal 58 as illustrated in FIG. 4. When microgravity conditions are reached, the activation housing 96 is rotated in the opposite direction to activate the crystal growth assemblies by permitting the plungers 78 to move the respective sealing plates 70 and release the plugs and bumpers 74, 76 from forcibly engaging the membrane from sealing relationship with the respective pedestal so that vapor equalization may be re-established between the precipitating agent in the reservoir and the protein solution in the wells 60 of the pedestals. Crystal growth subsequently ensues, and when de-activation is subsequently required, further vapor equalization is terminated by de-activating the system as aforesaid to safely contain crystals formed in each pedestal. If desired, a number of such canisters may be stored within a temperature controlled environment module. Six such canisters may be readily stored in such a module in side-by-side disposition.

Accordingly, apparatus is provided wherein a canister is provided for interfacing between ground based and flight based hardware and environments. The apparatus eliminates the need for late access requirement and individual loading since the protein solutions may be loaded into the trays and stored at cryogenic temperatures long in advance of a flight. Additionally, because of the nature of the apparatus, post-flight analysis is greatly simplified. Crystals may be photographed in the trays without disturbing the chambers and then released to desired personnel. A substantially greatly increased number of procedures may be performed with decreased cost per procedure relative to the prior art.

Thus, the present invention provides apparatus which permits rapid, convenient access to the microgravity environment, a greater number of samples to be processed, and the elimination of numerous problems associated with logistics relating to prior art crystal growth apparatus.

Numerous alterations of the structure herein disclosed will suggest themselves to those skilled in the art. However, it is to be understood that the present disclosure relates to the preferred embodiment of the invention which is for purposes of illustration only and not to be construed as a limitation of the invention. All such modifications which do not depart from the spirit of the invention are intended to be included within the scope of the appended claims.

Having thus set forth the nature of the invention, what is claimed herein is:

1. A protein crystal growth assembly for use in the vapor diffusion growth of protein crystals, comprising a tray having a planar upper surface and a plurality of spaced apart growth chambers recessed below said surface, each of said growth chambers having an upstanding pedestal and an annular reservoir disposed about said pedestal for receiving precipitants, each pedestal having an upper end disposed below said upper surface, a well recessed beneath said upper end of each pedestal defining a protein crystal growth receptacle, a flexible membrane positionable on said upper surface overlying said growth chambers, a sealing plate disposed above said membrane, said sealing plate having an upper surface and a planar lower surface, a plurality of bumpers depending downwardly from said lower surface, there being one bumper corresponding to each growth chamber, and each bumper being disposed on said plate for alignment with a respective upper end of each respective pedestal for abutting and forcing portions of said membrane against said upper end to seal said well when said lower surface of said plate abuts remaining portions of said membrane to sandwich said membrane into abutting relationship with said upper surface of said tray to seal said reservoirs.

2. A protein crystal growth assembly as recited in claim 1, wherein each reservoir contains a porous precipitant absorbing wick.

3. A protein crystal growth assembly as recited in claim 1, wherein said tray and said sealing plate include guide means for aligning said bumpers with respective upper ends of said pedestals.

4. A protein crystal growth assembly as recited in claim 3, wherein said guide means includes indentations in the periphery of each of said tray and said sealing plate at a plurality of aligned locations for receiving respective guide members.

5. A protein crystal growth assembly as recited in claim 1, wherein a plurality of said assemblies are disposed in stacked relationship one above the other.

6. A protein crystal growth assembly as recited in claim 5, further comprising:

a hollow canister disposed about said plurality of assemblies, said hollow canister being elongated along an axis of elongation from a bottom end to a top end;

a bottom closure means for closing said bottom end;

a top closure means for closing said top end;

means for urging each said sealing plate of said plurality of assemblies into abutment with said membrane associated with each said sealing plate.

7. A protein crystal growth assembly as recited in claim 6, wherein each reservoir contains a porous precipitant absorbing wick.

8. A protein crystal growth assembly as recited in claim 6, wherein said tray and said sealing plate include guide means for aligning said bumpers with respective upper ends of said pedestals.

9. A protein crystal growth assembly as recited in claim 8, wherein said guide means comprises a plurality of guide rods extending intermediate said bottom end and said top end substantially parallel to said axis of elongation, and indentations in the periphery of each of said trays and sealing plates at a plurality of aligned locations for receiving respective guide rods.

10. A protein crystal growth assembly as recited in claim 9, wherein each reservoir contains a porous precipitant absorbing wick.

11. A protein crystal growth assembly as recited in claim 6, wherein said means for selectively urging each said sealing plate of said plurality of assemblies into abutment with said membrane associated with each said sealing plate, comprises:

a selectively rotatable housing carried by said top closure means;

an activation plate disposed within said canister above the uppermost sealing plate; and drive means connecting said housing to said activation plate for translating said activation plate along said axis of elongation upon rotation of said housing.

12. A protein crystal growth assembly as recited in claim 11, wherein each reservoir contains a porous precipitant absorbing wick.

13. A protein crystal growth assembly as recited in claim 11, wherein said tray and sealing plate include guide means for aligning said bumpers with respective upper ends of said pedestals.

14. A protein crystal growth assembly as recited in claim 13, wherein said guide means comprises a plurality of guide rods extending intermediate said bottom end and said top end substantially parallel to said axis of elongation, and indentations in the periphery of each of said trays and sealing plates at a plurality of aligned locations for receiving respective guide rods.

15. A protein crystal growth assembly as recited in claim 11, wherein each of said sealing plates includes plunger means for urging the respective plate upwardly toward separation of said bumpers from said pedestals.

16. A protein crystal growth assembly as recited in claim 15, wherein said tray and said sealing plate include guide means for aligning said bumpers with respective upper ends of said pedestals.

17. A protein crystal growth assembly as recited in claim 15, wherein said guide means, comprises:

a plurality of guide rods extending intermediate said bottom end and said top end substantially parallel to said axis of elongation; and indentations in the periphery of each of said trays and sealing plates at a plurality of aligned locations for receiving respective guide rods.

18. Apparatus for growing protein crystals under microgravity environment, comprising a hollow canister elongated along an axis of elongation from a bottom end to a top end, bottom closure means for closing said bottom end, top closure means for closing said top end, a plurality of protein growth assemblies disposed in stacked relationship one above the other in said canister intermediate said bottom closure means and said top closure means, each of said assemblies comprising a tray having a planar upper surface and a plurality of spaced apart growth chambers recessed below said surface, each of said growth chambers having an upstanding pedestal and an annular reservoir disposed about said pedestal for receiving precipitants, each pedestal having an upper end disposed below said upper surface, a well recessed beneath said upper end of each pedestal defining a protein crystal growth receptacle, a flexible membrane positionable on said upper surface overlying said growth chambers, a sealing plate disposed above said membrane, said sealing plate having an upper surface and a planar lower surface, a plurality of bumpers depending downwardly from said lower surface, there being one bumper corresponding to each growth chamber, each bumper being disposed on said plate for alignment with a respective upper end of each respective pedestal for abutting and forcing portions of said membrane against said upper end to seal said well when said lower surface of said plate abuts remaining portions of said membrane to sandwich said membrane into abutting relationship with said upper surface of said tray to seal said reservoirs, and means for selectively urging said sealing plates into abutment with the membrane associated with a respective tray.

19. Apparatus as recited in claim 18, wherein each reservoir contains a porous precipitant absorbing wick.

20. Apparatus as recited in claim 18, wherein said tray and said sealing plate include guide means for aligning said bumpers with respective upper ends of said pedestals.

21. Apparatus as recited in claim 20, wherein said guide means comprises a plurality of guide rods extending intermediate said bottom end and said top end substantially parallel to said axis of elongation, and indentations in the periphery of each of said trays and sealing plates at a plurality of aligned locations for receiving respective guide rods.

22. Apparatus as recited in claim 21, wherein each reservoir contains a porous precipitant absorbing wick.

23. Apparatus as recited in claim 18, wherein said means for urging said sealing plates into abutment with the membrane associated with a respective plate comprises a selectively rotatable housing carried by said top closure means, an activation plate disposed within said canister above the uppermost sealing plate, and drive means connecting said housing to said activation plate for translating said activation plate along said axis of elongation upon rotation of said housing.

24. Apparatus as recited in claim 23, wherein each reservoir contains a porous precipitant absorbing wick.

25. Apparatus as recited in claim 23, wherein said tray and said sealing plate include guide means for aligning said bumpers with respective upper ends of said pedestals.

26. Apparatus as recited in claim 25, wherein said guide means comprises a plurality of guide rods extending intermediate said bottom end and said top end substantially parallel to said axis of elongation, and indentations in the periphery of each of said trays and sealing plates at a plurality of aligned locations for receiving respective guide rods.

27. Apparatus as recited in claim 23, wherein each of said sealing plates includes plunger means for urging the respective plate upwardly toward separation of said bumpers from said pedestals.

28. Apparatus as recited in claim 27, wherein said tray and said sealing plate include guide means for aligning said bumpers with respective upper ends of said pedestals.

29. Apparatus as recited in claim 28, wherein said guide means comprises a plurality of guide rods extending intermediate said bottom end and said top end substantially parallel to said axis of elongation, and indentations in the periphery of each of said trays and sealing plates at a plurality of aligned locations for receiving respective guide rods.

* * * * *